(12) United States Patent
Roitman et al.

(10) Patent No.: US 9,711,688 B2
(45) Date of Patent: *Jul. 18, 2017

(54) CONTROLLING LED EMISSION PATTERN USING OPTICALLY ACTIVE MATERIALS

(71) Applicant: KONINKLIJKE PHILIPS N.V., Eindhoven (NL)

(72) Inventors: Daniel Roitman, San Jose, CA (US); Mark Melvin Butterworth, Santa Clara, CA (US); Matthias Heidemann, Alsdorf (DE); Hans Helmut Bechtel, Roetgen (DE); Danielle Russell Chamberlin, Belmont, CA (US); Joan Liu, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/516,610

(22) Filed: Oct. 17, 2014

(65) Prior Publication Data

US 2015/0034990 A1      Feb. 5, 2015

Related U.S. Application Data

(63) Continuation-in-part of application No. 13/131,384, filed as application No. PCT/IB2009/055380 on Nov. 27, 2009, now Pat. No. 8,957,439.

(30) Foreign Application Priority Data

Dec. 2, 2008 (EP) .................................... 08170458

(51) Int. Cl.
*H01L 33/50* (2010.01)
*H01L 33/46* (2010.01)
*H01L 33/60* (2010.01)

(52) U.S. Cl.
CPC .............. *H01L 33/46* (2013.01); *H01L 33/60* (2013.01)

(58) Field of Classification Search
USPC ................................................... 257/98–100
See application file for complete search history.

(56) References Cited

U.S. PATENT DOCUMENTS 5,813,752 A    9/1998 Singer et al.
5,813,753 A    9/1998 Vriens et al.
(Continued)

FOREIGN PATENT DOCUMENTS

CN      1419300 A     5/2003
CN    101297412 A    10/2008
(Continued)

OTHER PUBLICATIONS

U.S. Appl. No. 14/618,406, Bechtel et al. Feb. 10, 2015.*
(Continued)

*Primary Examiner* — Samuel Gebremariam

(57) ABSTRACT

A light emission device comprising a light emitting element, a wavelength conversion (e.g. phosphor) element, and a filter that reduces Color over Angle (CoA) effects by at least partially reflecting light from the light emitting element that strike the filter at near-normal angles of incidence. In some embodiments, a combined phosphor and filter layer is formed over the LED die. The filter may comprise a dispersion of self-aligning moieties, such as dielectric platelets in a film that is vacuum laminated to the LED structure. Xirallic® Galaxy Blue pigment, comprising an aluminum oxide core coated on both sides with thin films of $SnO_2$, and $TiO_2$, and Ronastar® Blue, comprising Calcium Aluminum Borosilicate and $TiO_2$ may provide the dielectric platelets.

20 Claims, 2 Drawing Sheets

(56) References Cited

U.S. PATENT DOCUMENTS

| | | |
|---|---|---|
| 6,744,077 B2 | 6/2004 | Trottier et al. |
| 6,888,173 B2 | 5/2005 | Ishii et al. |
| 7,221,003 B2 | 5/2007 | Ueno et al. |
| 7,238,424 B2 | 7/2007 | Raksha |
| 7,378,792 B2 | 5/2008 | Huang et al. |
| 7,800,287 B2 | 9/2010 | Zheng et al. |
| 8,129,737 B2 | 3/2012 | Grotsch et al. |
| 8,138,671 B2 | 3/2012 | Hildenbrand et al. |
| 8,405,104 B2 | 3/2013 | Streubel et al. |
| 8,598,604 B2 | 12/2013 | Eisert et al. |
| 8,704,254 B2 | 4/2014 | Trottier et al. |
| 8,957,439 B2 * | 2/2015 | Bechtel et al. ................ 257/98 |
| 2003/0030060 A1 | 2/2003 | Okazaki |
| 2004/0032728 A1 | 2/2004 | Galli |
| 2004/0119082 A1 | 6/2004 | Sugawara |
| 2004/0238837 A1 | 12/2004 | Jacob et al. |
| 2005/0269582 A1 | 12/2005 | Mueller et al. |
| 2006/0202105 A1 | 9/2006 | Krames et al. |
| 2006/0208268 A1 | 9/2006 | Ueno |
| 2007/0111354 A1 | 5/2007 | Seong et al. |
| 2007/0241657 A1 | 10/2007 | Radkov et al. |
| 2007/0267646 A1 | 11/2007 | Wierer et al. |
| 2008/0054803 A1 | 3/2008 | Zhen |
| 2008/0179609 A1 | 7/2008 | Keuper |
| 2009/0236619 A1 | 9/2009 | Chakroborty |
| 2010/0247893 A1 | 9/2010 | Zimmerman |
| 2013/0168720 A1 | 7/2013 | Bergenek |

FOREIGN PATENT DOCUMENTS

| | | |
|---|---|---|
| DE | 102005062514 A1 | 3/2007 |
| EP | 0272760 A1 | 6/1988 |
| EP | 1571715 A1 | 9/2005 |
| EP | 2149163 A1 | 2/2010 |
| JP | 2006261540 | 9/2006 |
| JP | 2006261540 A | 9/2006 |
| KR | 10-2008-0059607 | 6/2008 |
| TW | 200729548 | 10/1995 |
| TW | 200822400 A | 5/2008 |
| TW | 200845426 A | 11/2008 |
| WO | WO-2004068603 A2 | 8/2004 |
| WO | WO-2006035388 A2 | 4/2006 |
| WO | 2007036214 A1 | 4/2007 |
| WO | WO-2008001636 A1 | 1/2008 |
| WO | 2008040298 A1 | 4/2008 |
| WO | 2008145096 A1 | 12/2008 |
| WO | 2010064177 A1 | 6/2010 |

OTHER PUBLICATIONS

EPO as ISA, PCTIB2009/055380 filed Nov. 27, 2009, "International Search Report and Written Opinion", mailed Apr. 13, 2010, 13 pages.
Final Rejection, Korea Application No. 10-2011-7015306, dated Apr. 20, 2016, 8 pages.
First Office Action, China Application No. 200980148279.5 dated Jan. 21, 2013, 20 pages.
First Office Action, Taiwan Application No. 098140838, dated Sep. 17, 2014, 12 pages.
Fourth Office Action, China Application No. 200980148279.5, dated Oct. 15, 2014, 14 pages.
Grant Decision, Russia Application No. 2011127140, dated Nov. 29, 2013, 11 pages.
Office Action, European Application No. 09775296.8, dated Mar. 24, 2016, 7 pages.
Preliminary Rejection, Korean Application No. 10-2011-7015306, dated Oct. 16, 2015, 9 pages.
Second Office Action, China Application No. 200980148279.5, dated Sep. 16, 2013, 18 pages.
Second Office Action, Taiwan Application No. 098140838, dated May 21, 2015, 4 pages.
Third Office Action, China Application No. 200980148279.5, dated Apr. 10, 2014, 19 pages.
Third Office Action, Taiwan Application No. 098140838, dated Aug. 20, 2015, 5 pages.

* cited by examiner

CONTROLLING LED EMISSION PATTERN USING OPTICALLY ACTIVE MATERIALS

This application is a Continuation-In-Part of U.S. patent application Ser. No. 13/131,384, filed 26 May 2011, which claims priority to EP 08170458.7, filed 2 Dec. 2008.

FIELD OF THE INVENTION

The invention relates to the field of light emission devices, and in particular to a light emitting device with a phosphor coating and a dielectric filter that reduces the color-over-angle (CoA), or yellow-ring, effect.

BACKGROUND OF THE INVENTION

Many broad spectrum (white) LEDs in the market consist of blue or near UV light sources capped with a wavelength conversion layer that partially absorbs the short-wavelength light from the source and emits lower energy photons (e.g. green and red). The wavelength conversion layer may be a phosphor layer comprising $Y_3Al_5O_{12}:Ce^{3+}$ (YAG:Ce), which absorbs blue light (nominally 400-500 nm) and emits yellow light (nominally 550-600 nm).

Because of the typical planar configuration of the blue light source and the phosphor layers, the optical path of the blue emission across the converting layer is longer at shallow angles than at the normal direction (perpendicular to the plane of the die). As a result, the far-field spectral emission of the LED contains a higher fraction of blue photons at normal angles (more bluish) than at shallow angles (more yellowish). This effect is called "Color over Angle" (CoA), and is often referred to as the "yellow ring problem".

Common Color over Angle correction techniques include increasing scattering of the phosphor layer and/or adding a scattering layer on top of the phosphor layer. For example, a highly scattering top layer (diffuser; ca. 50 microns thick) containing a dispersion of highly contrasting refractive index particles (titanium dioxide n~2.4) in silicones (n~1.5) may be used to "scramble" or reshuffle the directions of light emission. Scattering from nanoparticles is not truly isotropic, the nanoparticles scatter forward (away from the light source) more than backwards, and they also scatter more blue light than red light (lambda 4th power). Scattering from nanoparticles is also not angular-selective relative to the plane of the film. Also, in order for this layer to be effective to act as a diffuser, the optical path at shallow angles across the $TiO_2$ layer is longer than the optical path at normal angles, and the mean free-path must be much shorter than the thickness of the film. This results in the inefficient "backscattering" of green and red light so that green and red light is absorbed by the phosphor layer.

In general, diffuser layers produce significantly lower device efficiency. Furthermore, the uniform dispersion of $TiO_2$ nanoparticles requires specialized high shear mixing equipment that adds to the cost of manufacturing. In addition, several binder materials are solvent based (toluene, cyclohexanone), and are not amenable for use in high shear mixing systems (e.g. three roll mill).

SUMMARY OF THE INVENTION

Its is an object of the invention to provide a light emission diode (LED) assembly that corrects for color over angle, while maintaining high light emission efficiency.

The light emission diode (LED) assembly according to the invention may comprise a LED die, a phosphor layer, and a filter layer, wherein said filter layer is developed in such a manner that light rays emitted from the LED die are at least partially reflected depending on their emission angle to the normal on the filter layer. In some embodiments, a combined phosphor and filter layer is formed over the LED die.

The LED die may be a blue emitting LED, and the phosphor layer may be $Y_3Al_5O_{12}:Ce^{3+}$ (YAG:Ce). The filter layer is preferably a dielectric filter layer. At small emission angles, preferably emission angles between 0° to 30° to the normal of the filter layer, partial reflection of the light rays from the LED die (e.g. with a wavelength of about 400 nm to 500 nm) is provided. At emission angle between 30° to 90° to the normal of the filter, the filter layer provides near full transmission for light rays emitted by the LED die as well as the light emitted by the phosphor layer. The partial reflections of the (blue) light rays emitted by the LED die depending on their emission angle provides a substantially uniform color over angle emission without loss of efficiency of the light emitted by LED.

For uniform white light emitted by the LED die the emitted intensity ratio of directly emitted light from the LED die and converted light from the phosphor layer is preferably constant over all angles. Usually, light emitted by the LED provides a cudgel-shaped form in the area of small emission angle, preferably an emission angle of about 0° to 30° to the normal on the filter layer. However, the yellow light emitted by the phosphor usually provides a ball-shaped form over the whole emission angle of about 0° to 90°. Thus, there are areas, especially at larger emission angles, such as between 30° to 90°, where the ratio of blue light to yellow light decreases. By reflection of a certain amount of the blue light for small emission angles of about 0° to 30° it is possible to transform the cudgel-shaped form of the blue light into a ball-shaped form so that the blue light and the yellow light have substantially the same ratio over the whole emission angle from 0° to 90°. Thus, a superposition of yellow light and blue light over the whole emission angle is obtained so that uniform white light is emitted by the LED assembly over the whole emission angle without a color over angle (yellow ring) problem.

In one alternative, the filter layer reflects the light rays with an emission angle of about 0° to 30°, preferably in the range of 0° to 20°, to the normal on the filter layer. The reflected light rays are blue light rays of the emitted light of the LED die with a wavelength of about 400 nm to 500 nm, preferably of about 420 nm to 490 nm.

In a preferred embodiment of the invention about 10% to 50%, preferably of about 15% to 30%, of the light rays emitted by the LED die may be reflected by the filter layer depending on their emission angle. The reflected light rays may be blue light rays of the emitted light of the LED die with a wavelength of about 400 nm to 500 nm, preferably of about 420 nm to 490 nm.

The filter layer comprises preferably a dispersion of self-aligning moieties, such as dielectric platelets in a film that is vacuum laminated to the LED structure. Xirallic® 160-23 SW GALAXY BLUE (XGB) by Merck KGaA is a commercially available dielectric pigment comprising an Aluminum oxide core coated on both sides with thin films of $SnO_2$ and $TiO_2$ that provides an angle dependent reflection to primarily blue light. Similarly, Ronastar® Blue, also by Merck KGaA, is a commercially available dielectric pigment comprising Calcium Aluminum Borosilicate and $TiO_2$ that also provides an angle dependent reflection to primarily blue light.

DETAILED DESCRIPTION OF THE EMBODIMENTS

Figure 1:
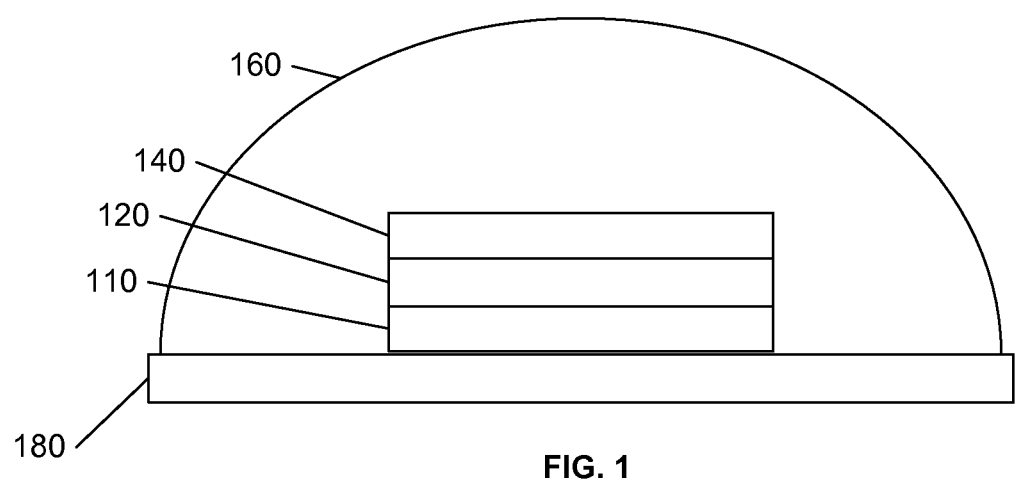
FIG. 1 is a schematic view of an embodiment of a light emitting diode assembly according to the invention.

FIG. 1 shows a first embodiment of a light emission diode (LED) assembly according to the invention with a LED die 110, a wavelength conversion layer 120 and a filter layer 140. The led die 110, the wavelength conversion layer 120 and the filter 140 may be covered by a protective housing 160, which may be shaped to provide a particular light emission pattern.

The LED die 110 emits blue light with a wavelength of about 400 nm to 500 nm and is positioned on a substrate 180 of the LED assembly. On the top of the LED die 110 the wavelength conversion layer 120 is positioned.

The wavelength conversion layer 120 may, for example, emit yellow light with a wavelength of about 570 nm to 590 nm when illuminated by blue light. The wavelength conversion layer 120 may comprise a Lumiramic plate and/or a phosphor powder embedded in a transparent matrix material. The thickness of the wavelength conversion layer 120 may be about 100 µm to 120 µm. On the top of the wavelength conversion layer 120 the filter layer 140 is positioned.

Figure 2:
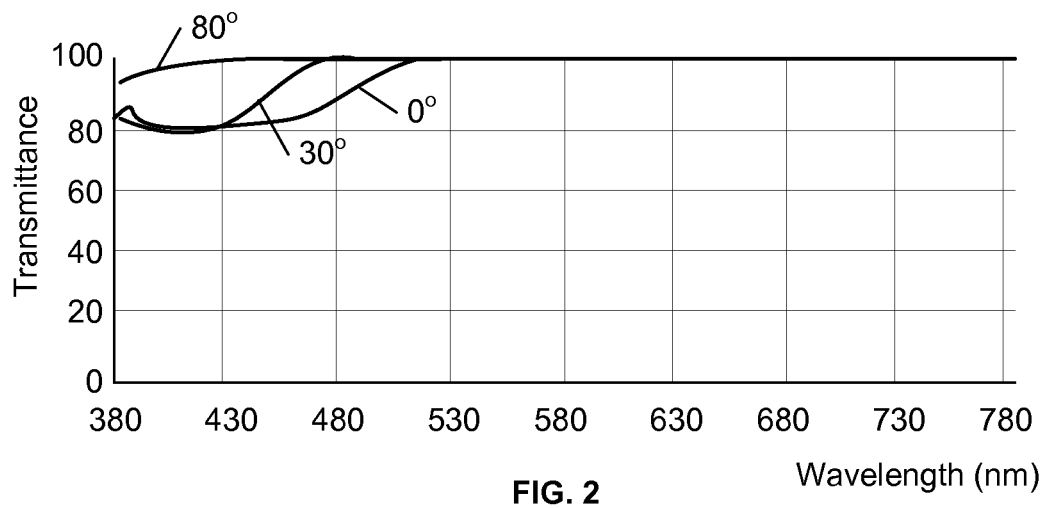
FIG. 2 is a graph showing the transmittance of an example filter layer that varies with the emission angle and the wavelength of the light emitted by the LED die.

FIG. 2 shows a graph of the transmittance of an example filter layer 140 that varies based on the emission angle and the wavelength of the light emitted by the LED die 110.

The curves shown in the graph correspond to the transmittance of blue light at emission angles of about 0°, 30°, and 80° relative to normal to the surface of the filter 140, respectively. The transmittance of light above 530 nm is substantially 100%, regardless of the angle of incidence.

As can be seen by the 0° curve, only about 80% of the blue light under 480 nm that strikes the filter 140 at 0° is transmitted, the remaining 20% being reflected back toward the wavelength conversion layer 120 and potentially converted into yellow light. Light above about 460 nm that strikes at 30° is fully transmitted through the filter 140, and all of the light above 400 nm that strikes at 80° is fully transmitted through the filter 140. That is, the example filter 140 has the effect of reducing the emission of blue light when the light strikes the filter 140 at angles near normal, but not affecting the emission of blue light when the light strikes the filter 140 at angles far from normal. In an example embodiment, at least 10% of the light that strikes the filter within +/−20° of normal is reflected, and less than 10% of the light that strikes the filter above 60° from normal is reflected. In this manner, due to the reduction of blue light in the normal and near normal directions, the shape of the blue light emission pattern is more consistent with the shape of the yellow light emission pattern.

The filter layer 140 may comprise a dielectric layer coating of alternating low and high reflective index materials, such as $Nb_2O_5$ and $SiO_2$, as detailed in the parent to this application, U.S. patent application Ser. No. 13/131,384, filed 26 May 2011 for Hans-Helmut Bechtel, Matthias Heidemann, Peter J. Schmidt, and Thomas Diederich, which is incorporated by reference herein. However, the creation of a monolithic plate comprising about twenty or more layers of materials at closely controlled thicknesses ranging from 1 nm to 500 nm, for example, may be a costly process. And, if the upper surface of the wavelength conversion layer 120 is not flat, the creation of thin layers of alternating low and high reflective index material may not be feasible.

Alternatively, as detailed further below, the inventors of this application have discovered that a layer of a multitude of small platelets, each of which is a tiny filter that is substantially smaller than the dimensions of the LED die 110, provides wavelength-dependent and angular-dependent reflective properties.

Figure 3A:
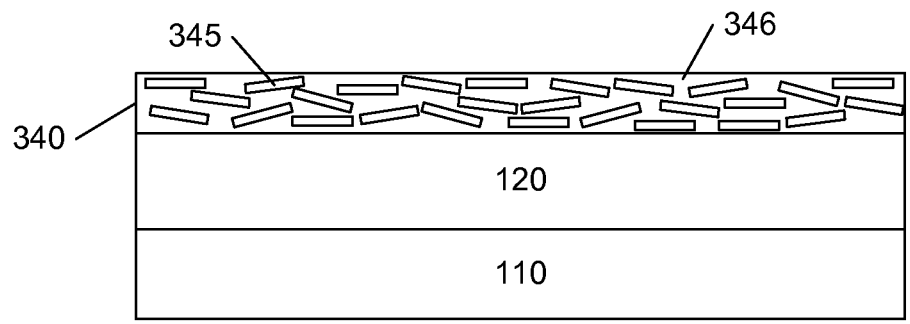
FIGS. 3A-3C are example embodiments of an LED structure having dielectric platelets that serve to reflect blue light at near normal angles of incidence.
Figure 3B:
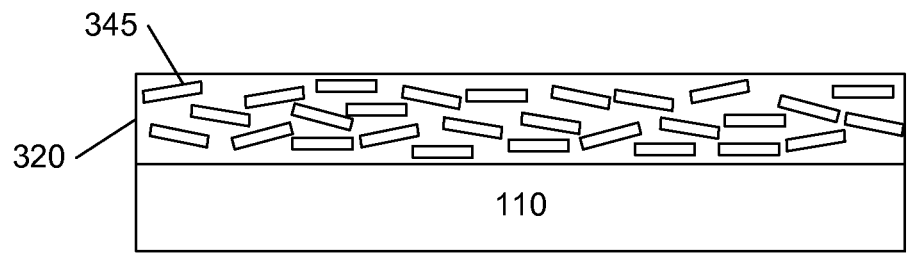
Figure 3C:
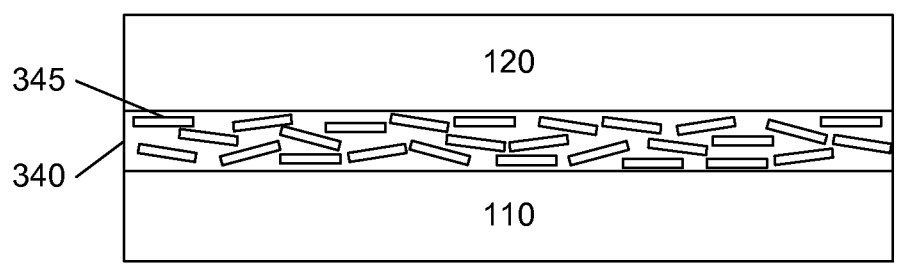

FIGS. 3A-3C are example embodiments of LED structures having dielectric platelets that serve to reflect a substantial amount (e.g. at least 10%) of blue light at near normal angles of incidence (e.g. within about 20° of normal) while transmitting substantially all of the blue light at angles of incidence that are far from normal (e.g. greater than about 45° from normal).

In FIG. 3A, a wavelength conversion (e.g. phosphor) layer 120 is atop an LED die 110 that emits light into the wavelength conversion layer 120. The layer 120 may include a YAG:Ce phosphor that converts blue light to yellow light; however, it could be any of a number of combinations of wavelength conversion materials. In like manner, the LED die 110 may emit a different wavelength of light from blue, but for ease of understanding of this invention, the term 'blue' light is used as the light emitted from the LED die 110.

A filter layer 340 is applied over the wavelength conversion layer 120, and is designed to reflect at least a portion of the amount of light that is emitted from the LED 110 at near normal angles of incidence to the filter 340, while transmitting virtually all of the light that is emitted from the LED 110 at angles that are far off normal to the filter 340. The filter layer 340 also transmits virtually all of the light that is emitted by the wavelength conversion layer 120 irrespective of the angle at which that light strikes the filter layer 340.

The filter layer 340 includes a dispersion of self-aligning moieties such as dielectric platelets 345 that are substantially smaller than the size of the LED 110, but large enough (>5 um) that they are easily dispersed (i.e. low shear) into a clear binder material 346.

Each of the platelets 345 is a tiny filter, being many times smaller than the LED 110 dimension; as such, and as illustrated in FIG. 3A, the platelets 345 do not need to be perfectly aligned, or be a monolithic film or sheet. The filter 340 is a composite of many individual small pieces, initially in powder form, that are predominantly aligned with the plane of the LED 110, or with other desired orientations in the device. In some embodiments, an alignment that is just higher than random orientation may be sufficient.

The alignment of the platelets 345 is achieved by the flow of the film during coating, molding or stamping, or by some other means, such as sedimentation, spraying and drying, or by self-assembly (electrostatic) from a suspension. The platelets orient themselves predominantly parallel to the surfaces by any of these forces by virtue of their aspect ratios. In an example embodiment, the platelets 345 are aligned with the surface of the wavelength conversion layer 120 by casting the binder material 346 with the platelets 345 as a separate thin film (about 50 um) at a shear rate of about 300-500 $\text{sec}^{-1}$, which is substantially less than the high shear rate required to produce a conventional scattering layer of $TiO_2$.

Xirallic® Galaxy Blue (XGB) is an optically active pigment that is commonly used to create a 'shimmering metallic' finish on automobiles. XGB comprises an aluminium oxide core with a refractive index of about 1.75 coated on both sides with thin films of $SnO_2$, and $TiO_2$ with a refractive index of about 2.6, and serves as an effective dielectric filter for blue light. Another example is provided by Ronastar® Blue, which is commonly used in the cosmetic industry to add luster. Ronastar® Blue consists of 10-100 um platelets of Calcium Aluminum Borosilicate and $TiO_2$, and may also serve as an effective dielectric filter for blue light. There are many other combinations of materials and properties that may be used. For example, there are commercially available "pearlescent or nacreous pigments" that are based on mica and $TiO_2$, as well as hybrid dielectric-metallic platelets, and photonic crystals. See, for example, U.S. Pat. No. 7,238,424 "ALL-DIELECTRIC OPTICALLY VARIABLE PIGMENTS" issued to V. Rashka et al. on 3 Jul. 2007, which is incorporated by reference herein. See also "Special Effects Pigments: Technical Basics and Applications, by G. Pfaf (2008). "Pigments, Inorganic, 6. Luster Pigments", by G. Pfaff, K-D Franz, R Emmert, K. Nitta, and R. Besold, in Ullman's Encyclopedia of Industrial Chemistry, 2012 Wiley-VCH Verlag GmbH & Co, KGaA, Weinheim.

Different angular reflective patterns may be obtained by varying the density of the dielectric platelets.

Figure 5:
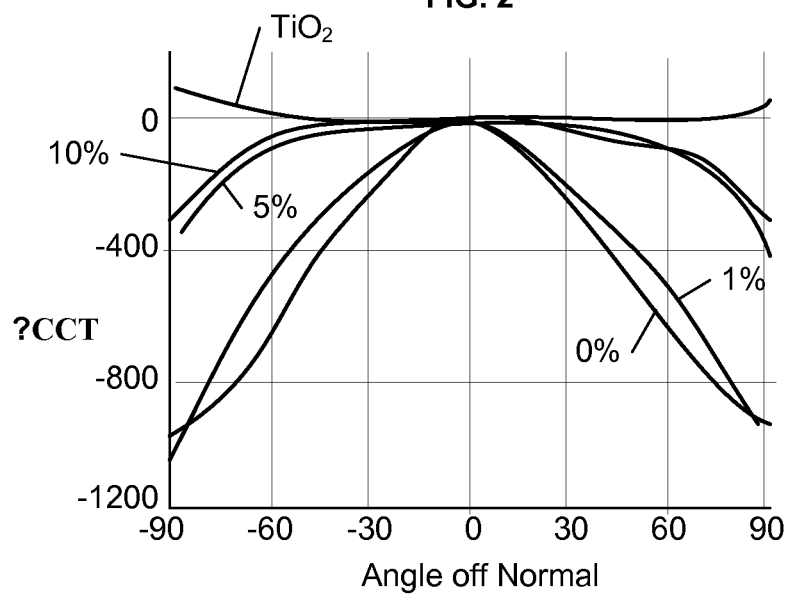
FIG. 5 is an example plot of changes of correlated color temperature (ACCT) as a function of the angle off normal to the surface of the filter layer.

FIG. 5 illustrates a comparison of the color over angle effect with different proportions of platelets using XGB. The graph illustrates the change of correlated color temperature (ACCT) as a function of the angle off normal to the surface of the filter layer 340.

The upper line, labeled $TiO_2$ is a reference curve illustrating a minimal color over angle effect using a conventional scattering top layer of $TiO_2$ dispersed in silicone As can be seen, there is virtually no change of color between −60° and +60° relative to normal, and only a slight change beyond that range.

The curve labeled 0% is a baseline plot of a (non-filter) layer containing no XGB. As can be seen, an unfiltered LED structure exhibits a significant color over angle effect. At +/−60°, the CCT is about 600° different from the CCT in the normal direction.

The curve labeled 1% illustrates the color over angle effect using a filter layer that contains 1% XGB by weight in a silicone fill material. As this low concentration, an insufficient amount of blue light in the near normal direction is reflected, resulting in an only slightly improved color over angle effect.

The curves labeled 5% and 10% illustrate a substantial improvement in the color over angle effect, reducing the change of color over the angles +/−60° to under 150°. Although these concentrations do not correct the color over angle effect as well as the conventional scattering $TiO_2$ layer, the correction will satisfy the requirements of many applications. Additionally, because the filter layer 340 reflects the blue light, rather than scattering the light, the light output from the LED structure of FIG. 3A with 5-10% XGB was found to be about 3% higher than the LED with a scattering $TiO_2$ layer. Also as noted above, the uniform dispersion of $TiO_2$ nanoparticles in a scattering layer requires specialized high shear mixing equipment (e.g. three roll mill) that adds to the cost of manufacturing, and often unsuitable for some binder materials that are formulated in the presence of solvents, including toluene and cyclohexanone.

FIG. 3B illustrates an embodiment wherein the optically active platelets 345 (dielectric filters) are dispersed within a single layer 320. That is, the material forming the layer 320 includes both phosphor particles and the optically active platelets 345. Although this embodiment reduces the number of individual layers, it may not be as efficient as the embodiment of FIG. 3A because the reflected blue light does not travel through the entire wavelength conversion layer 120 as it does in FIG. 3A.

FIG. 3C illustrates an embodiment wherein the filter layer 340 is situated between the LED 110 and the wavelength conversion layer 120. This embodiment 340 will provide the desired reduction of near-normal emitted blue light, but it may be less efficient because none of the reflected blue light enters the wavelength conversion layer 120.

Although FIGS. 3A-3C illustrate LED structures with layers 110, 120, 340 having a rectangular profile, in some embodiments, the filter layer 340 extends beyond the layers 110, 120 and forms a protective coating for the LED structure.

Figure 4:
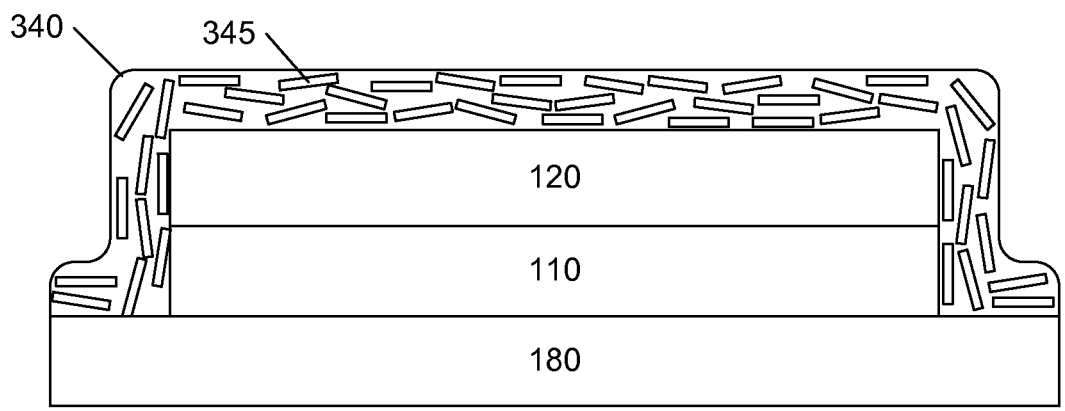
FIG. 4 is an example embodiment of an LED structure on a substrate with a layer of dielectric platelets.

FIG. 4 is an example embodiment of an LED structure on a substrate with a layer of dielectric platelets that encases the LED 110 and wavelength conversion layer 120. In some embodiments, the wavelength conversion layer 120 may also extend over the LED 110.

Typically, multiple structures comprising an LED 110 and wavelength conversion layer 120 may be situated on a substrate 180, separated by a lateral space between structures. The filter layer 340 may be applied in semiliquid form over the entire substrate 180, atop and between the LED structures. Thereafter, the substrate 180 may be sliced/diced to create individual LED structures comprising a piece of the substrate 180, an LED 110, wavelength conversion layer 120, and filter layer 340.

In an example embodiment, 5.0 g of XGB powder was dispensed in a polyethylene mixer cup, and combined with 13.3 g of a clear resin consisting in 25 w % solvent (toluene) and 75 w % solids (uncured silicone). The materials were mixed for 2 minutes in a planetary centrifugal mixer (Thinky ARV-5000) under normal atmospheric conditions. A film was cast on a releasable PET liner using a blade coater. The typical strain rate was in the order of 300-500 $\text{sec}^{-1}$ (~50 mm/s blade speed with a ~150 um gap). After drying the film at ~100° C. under vacuum for 5 minutes, the final thickness was 50 um. The XGB film was vacuum laminated to a ceramic tile populated by LED dies, and was cured at 150° C. under atmospheric conditions for 4 hours. After cure the individual dies were separated by dicing and tested.

It is significant to note that the arrangement of the platelets 345 in the filter layer 340 of FIG. 4 provides a barrier coating that protects the LED 110 and wavelength conversion layer 120 from external elements, including moisture and gases. In some embodiments, the protective encapsulant 160 of FIG. 1 is not needed, or only needed to achieve a particular optical effect. The platelets 345 in the filter layer 340 also improve the thermal conductivity of the structure, particularly at higher levels of concentration.

While the invention has been illustrated and described in detail in the drawings and foregoing description, such illustration and description are to be considered illustrative or exemplary and not restrictive, the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting device comprising:
   alight emitting element that emits light;
   a wavelength conversion element disposed over the light emitting element that receives the light emitted from the light emitting element and converts at least some of the light to light of a different wavelength; and
   a dielectric filter comprising a layer of material comprising dielectric platelets disposed over the wavelength conversion element that reflects at least 10% of the light that is emitted from the light emitting element at angles of incidence within +/−20 degrees of normal to the surface of the filter and reflects less than 10% of the light that is emitted from the light emitting element at angles of incidence at least 60 degrees from normal to the surface of the filter,
   the dielectric filter providing a variance in correlated color temperature (CCT) of less than 150 degrees at angles between −60° and +60° relative to the normal to the surface of the filter.

2. The device of claim 1, wherein the dielectric filter comprises a film that is adhered to the wavelength conversion element.

3. The device of claim 1, wherein the wavelength conversion element is situated between the light emitting element and the dielectric filter.

4. The device of claim 1, wherein the wavelength conversion element and the dielectric filter element comprise a single element that includes wavelength conversion particles and the dielectric platelets.

5. The device of claim 1, wherein the light emitting element is situated on a substrate, and the dielectric filter encases the light emitting element upon the substrate to provide a barrier that protects the light emitting element from external elements, including moisture and gas.

6. The device of claim 1, wherein the light emitted from the light emitting element is in the range of 400-500 nm, and the wavelength conversion element converts a portion of the emitted light into light that is in the range of 550-600 nm.

7. A light emitting device comprising:
   a light emitting element that emits light;
   a wavelength conversion element disposed over the light emitting element that receives the light emitted front the light emitting element and converts at least some of the light to light of a different wavelength; and
   a dielectric filter comprising a layer of material comprising Xirallic® Galaxy Blue dielectric platelets disposed over the wavelength conversion element that reflects at least 10% of the light that is emitted from the light emitting element at angles of incidence within +/−20 degrees of normal to the surface of the filter and reflects less than 10% of the light that is emitted from the light emitting element at angles of incidence at least 60 degrees from normal to the surface of the filter.

8. The device of claim 7, wherein the wavelength conversion element and the dielectric filter element comprise a single element that includes wavelength conversion particles and the dielectric platelets.

9. The device of claim 7, wherein the light emitting element is situated on a substrate, and the dielectric filter encases the light emitting element on the substrate to provide a barrier that protects the light emitting element from external elements, including moisture and gas.

10. The device of claim 7, wherein the light emitted from the light emitting element is in the range of 400-500 nm, and the wavelength conversion element converts a portion of the emitted light into light that is in the range of 550-600 nm.

11. A light emitting device comprising:
    a light emitting element that emits light;
    a wavelength conversion element disposed over the light emitting element that receives the light emitted from the light emitting element and converts at least some of the light to light of a different wavelength; and
    a dielectric filter comprising a layer of material comprising Ronastar® Blue dielectric platelets disposed over the wavelength conversion element that reflects at least 10% of the light that is emitted from the light emitting element at angles of incidence within +/−20 degrees of normal to the surface of the filter and reflects less than 10% of the light that is emitted from the light emitting element at angles of incidence at least 60 degrees from normal to the surface of the filter.

12. The device of claim 11, wherein the wavelength conversion element and the dielectric filter element comprise a single element that includes wavelength conversion particles and the dielectric platelets.

13. The device of claim 11, wherein the light emitting element is situated on a substrate, and the dielectric filter encases the light emitting element on the substrate to provide a barrier that protects the light emitting element from external elements, including moisture and gas.

14. The device of claim 11, wherein the light emitted from the light emitting element is in the range of 400-500 nm, and the wavelength conversion element converts a portion of the emitted light into light that is in the range of 550-600 nm.

15. A method comprising:
    providing a plurality of light emitting elements on a substrate;
    covering each light emitting element with a wavelength conversion element;
    covering each wavelength conversion element with a dielectric filter that reflects at least 10% of light emitted from the light emitting element at angles between 20+/−20 degrees of normal to a surface of the dielectric filter and reflects less than 10% of light emitted from the light emitting element at angles of incidence that are over 60 degrees from the normal of the dielectric filter;
    wherein the dielectric filter comprises a layer of material comprising dielectric platelets; and
    creating the dielectric filter as a film that is adhered to the wavelength conversion elements, wherein crating the dielectric filter includes dispersing the dielectric platelets in a resin, and casting the resin on a releasable liner.

16. The method of claim 15, wherein a blade coater provides a strain rate of 300-500 sec$^{-1}$ to align the platelets parallel to the surface of the filter.

17. The method of claim 15, wherein the light emitted from the light emitting element is in the range of 400-500 nm, and the wavelength conversion element converts a portion of the emitted light into light that is in the range of 550-600 nm.

18. The method of claim 15 wherein covering each wavelength conversion element with a dielectric filter comprises encasing the light emitting element and the wavelength conversion element to provide a barrier that protects the light emitting element from external elements.

19. A method comprising:
  providing a plurality of light emitting elements on a substrate;
  covering each light emitting element with a wavelength conversion element; and
  covering each wavelength conversion element with a dielectric filter that reflects at least 10% of light emitted from the light emitting element at angles between 20+/−20 degrees of normal to a surface of the dielectric filter and reflects less than 10% of light emitted from the light emitting element at angles of incidence that are over 60 degrees from the normal of the dielectric filter;
  wherein the dielectric filter comprises a layer of material comprising dielectric platelets;
  wherein the dielectric platelets comprise at least one of: Xirallic® Galaxy Blue particles and Ronastar® Blue particles.

20. The method of claim 19 wherein covering each wavelength conversion element with a dielectric filter comprises encasing the light emitting element and the wavelength conversion element to provide a barrier that protects the light emitting element from external elements.

* * * * *